United States Patent
Warren

(10) Patent No.: US 8,381,077 B2
(45) Date of Patent: Feb. 19, 2013

(54) SYSTEMS AND METHODS FOR IMPLEMENTING ERROR CORRECTION IN RELATION TO A FLASH MEMORY

(75) Inventor: Robert W. Warren, Loveland, CO (US)

(73) Assignee: LSI Corporation, Milpitas, CA (US)

( * ) Notice: Subject to any disclaimer, the term of this patent is extended or adjusted under 35 U.S.C. 154(b) by 394 days.

(21) Appl. No.: 12/774,077

(22) Filed: May 5, 2010

(65) Prior Publication Data

US 2011/0060968 A1    Mar. 10, 2011

Related U.S. Application Data

(60) Provisional application No. 61/240,546, filed on Sep. 8, 2009.

(51) Int. Cl.
   *G11C 29/00* (2006.01)

(52) U.S. Cl. ....... 714/773; 714/755; 714/757; 714/6.24; 714/48; 714/746; 714/758; 714/764; 714/767; 714/776; 714/799

(58) Field of Classification Search .................. None
   See application file for complete search history.

(56) References Cited

U.S. PATENT DOCUMENTS

| | | | |
|---|---|---|---|
| 7,127,549 B2 | 10/2006 | Sinclair | |
| 7,310,699 B2 | 12/2007 | Sinclair | |
| 7,516,371 B2 * | 4/2009 | Sakaue et al. | 714/52 |
| 7,589,997 B2 * | 9/2009 | Honma et al. | 365/185.03 |
| 2003/0095438 A1 * | 5/2003 | Hosogane | 365/185.21 |
| 2005/0172067 A1 | 8/2005 | Sinclair | |
| 2006/0053246 A1 * | 3/2006 | Lee | 711/100 |
| 2007/0028040 A1 | 2/2007 | Sinclair | |
| 2009/0067303 A1 | 3/2009 | Poo | |
| 2009/0100307 A1 * | 4/2009 | Lee | 714/746 |
| 2009/0113272 A1 * | 4/2009 | Tan et al. | 714/765 |
| 2009/0158124 A1 * | 6/2009 | Kawai et al. | 714/763 |
| 2009/0172280 A1 | 7/2009 | Trika et al. | |
| 2009/0282308 A1 * | 11/2009 | Gutsche et al. | 714/746 |
| 2010/0049910 A1 * | 2/2010 | Conley et al. | 711/103 |
| 2010/0122200 A1 * | 5/2010 | Merry et al. | 715/771 |
| 2011/0040924 A1 * | 2/2011 | Selinger | 711/103 |
| 2011/0289387 A1 * | 11/2011 | Roohparvar et al. | 714/768 |
| 2012/0151130 A1 * | 6/2012 | Merry et al. | 711/103 |

FOREIGN PATENT DOCUMENTS

KR    10/2009/0013394    2/2009

OTHER PUBLICATIONS

U.S. Appl. No. 12/743,454, filed May 28, 2009, Dreifus et al.
U.S. Appl. No. 12/691,797, filed Jan. 22, 2010, Warren et al.
U.S. Appl. No. 12/691,819, filed Jan. 22, 2010, Warren, et al.
U.S. Appl. No. 12/716,257, filed Mar. 2, 2010, Warren, Robert.
U.S. Appl. No. 12/716,259, filed Mar. 2, 2010, Warren, Robert.
U.S. Appl. No. 12/716,262, filed Mar. 2, 2010, Warren, Robert.
U.S. Appl. No. 12/774,055, filed May 5, 2010, Warren, Robert.
U.S. Appl. No. 12/716,265, filed Mar. 2, 2010, Warren, Robert.
U.S. Appl. No. 12/772,005, filed Apr. 3, 2010, Warren, et al.
U.S. Appl. No. 12/774,065, filed May 5, 2010, Warren, Robert.

\* cited by examiner

*Primary Examiner* — John Trimmings
(74) *Attorney, Agent, or Firm* — Hamilton DeSanctis & Cha

(57) ABSTRACT

Various embodiments of the present invention provide systems, methods and circuits for memories and utilization thereof. As one example, a memory system is disclosed that includes a flash memory device and a flash access circuit. The flash access circuit is operable to perform an error code encoding algorithm on a data set to yield an error code, to write the data set to the flash memory device at a first location, and to write the error code to the flash memory device at a second location.

22 Claims, 4 Drawing Sheets

SYSTEMS AND METHODS FOR IMPLEMENTING ERROR CORRECTION IN RELATION TO A FLASH MEMORY

CROSS REFERENCE TO RELATED APPLICATIONS

The present application claims priority to (is a non-provisional of) U.S. Pat. App. No. 61/240,546, entitled "Systems and Methods for Extending Flash Memory Life Using Adaptive Error Correction Encoding Cycle", and filed Sep. 8, 2009 by Warren. The entirety of the aforementioned provisional patent application is incorporated herein by reference for all purposes.

BACKGROUND OF THE INVENTION

The present inventions are related to systems and methods for extending flash memory lifecycle, and more particularly to systems and methods for utilizing error correction methods to enhance the lifecycle of a flash memory.

Flash memories have been used in a variety of devices where information stored by the device must be maintained even when power is lost to the device. A typical flash memory device exhibits a number of cells that can be charged to four distinct voltage levels representing two bits of data stored to the cell. By doing this, the memory density of a given flash device can be increased dramatically for the cost of a few additional comparators and a reasonable increase in write logic. Currently, there is a trend toward further increasing the number of bits that may be stored in any given cell by increasing the number of distinct voltage levels that may be programmed to the cell. For example, there is a trend toward increasing the number of distinct voltage levels to eight so that each cell can hold three data bits. While the process of increasing the number of bits stored to any given flash memory cell allows for increasing bit densities, it can result in a marked decline in the lifecycle of the flash memory. This decline in the lifecycle of a memory device limits its use in various memory systems where the number of writes is expected to be significant.

Hence, for at least the aforementioned reason, there exists a need in the art for advanced systems and methods for implementing memory systems utilizing flash memory devices.

BRIEF SUMMARY OF THE INVENTION

The present inventions are related to systems and methods for extending flash memory lifecycle, and more particularly to systems and methods for utilizing error correction methods to enhance the lifecycle of a flash memory.

Various embodiments of the present invention provide memory systems that include a flash memory device and a flash access circuit. The flash access circuit is operable to perform an error code encoding algorithm on a data set to yield an error code, to write the data set to the flash memory device at a first location, and to write the error code to the flash memory device at a second location. In some cases, the first location is non-contiguous with the second location. In other cases, the first location and the second location are contiguous. In particular cases, the error code encoding algorithm is a Reed Solomon error correction encoding algorithm.

In various instances of the aforementioned embodiments, the flash access circuit is further operable to: read another data set from a third location in the flash memory device, and to read another error code from a fourth location in the flash memory device. The flash access circuit performs an error code decoding algorithm on the second data set resulting the in a change to at least one bit of the other data set. In some such instance, the third location is contiguous with the fourth location. In other such instances, the third location is non-contiguous with the fourth location. In particular cases, the error code decoding algorithm is a Reed Solomon error correction decoding algorithm.

In various instances of the aforementioned embodiments, the flash access circuit is further operable to determine a health status of the flash memory device. In such instances, the flash access circuit adaptively writes the error code to the flash memory device based at least in part on the health status. The aforementioned health status may be, but is not limited to, a number of remaining good blocks in the flash memory device, or a percentage of remaining good blocks in the flash memory device. In particular cases, the flash access circuit is operable to omit writing the error code to the flash memory device when the health status is above a defined level, and the flash access circuit is operable to write the error code to the flash memory device when the health status is below the defined level. In other cases, the flash access circuit is operable to omit performing the error code encoding algorithm on the data set to yield the error code and writing the error code to the flash memory device when the health status is above a defined level.

Other embodiments of the present invention provide memory access circuits that include an error code encoding circuit and a data write circuit. The error code encoding circuit is operable to receive a data set and to perform an error code encoding algorithm on the data set to yield an error code. The data circuit is operable to adaptively write information to a memory device based upon a health status of the memory device. The adaptively written information is either the data set alone or a combination of the data set and the error code. In some cases, the circuit further includes a health status determination circuit that is operable to determine the health status of the memory device. The health status may be, but is not limited to, a number of remaining good blocks in the flash memory device, or a percentage of remaining good blocks in the flash memory device. In various case, the combination of the data set and the error code are written to the memory device when the health status is below a defined threshold, and the data set alone is written to the memory device when the health status is above a defined threshold.

In various instances of the aforementioned embodiments, the circuit further includes an access controller circuit that is operable to update a table indicating whether an error code is available in relation to a block of memory in the memory device. In some such cases, the circuit further includes a data read circuit and an error code decoding circuit. The data read circuit is operable to read another data set and another error code corresponding to the other data set from the memory device. The error code decoding circuit operable to receive the other data set and the other error code, and to perform an error code decoding algorithm on the other data set such at least one bit of the other data set is corrected. In other cases, the circuit further includes a data read circuit and an error code encoding circuit. The data read circuit is operable to read another data set from the memory device, and the access controller circuit operable to provide an indication that an error code is not available in relation to the second data set. The error code decoding circuit is operable to receive the other data set and the indication that an error code is not available in relation to the second data set, and based thereon to omit performing an error code decoding algorithm on the second data set.

Yet other embodiments of the present invention provide methods for implementing error correction processing in relation to a flash memory device. The methods include: receiving a write request and a data set; determining a health status of a flash memory device; performing an error code encoding algorithm on the data set to yield an error code based at least in part on the health status of the flash memory device; writing the data set to the flash memory device; and writing the error code to the flash memory device. In some cases, the methods further include accessing the data set from the flash memory device; accessing the error code from the flash memory device; and performing an error code decoding using the data set and the error code such that at least one bit of the data set is corrected.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for extending flash memory lifecycle, and more particularly to systems and methods for utilizing error correction methods to enhance the lifecycle of a flash memory.

Flash memory devices degrade as a function of the number of times they are utilized. Typically, a flash memory device is rated based upon the number of write accesses that can be supported before the device fails. To assure that memory cells within a flash memory degrade at approximately the same rate, various wear leveling algorithms are utilized. Such wear leveling algorithms move data within the flash memory device to distribute write accesses more evenly between cells. Further, flash memory devices often include unused cells that may be used in place of cells that exhibit early failure. By implementing these approaches, the lifecycle of a flash memory device can be extended.

Figure 1:
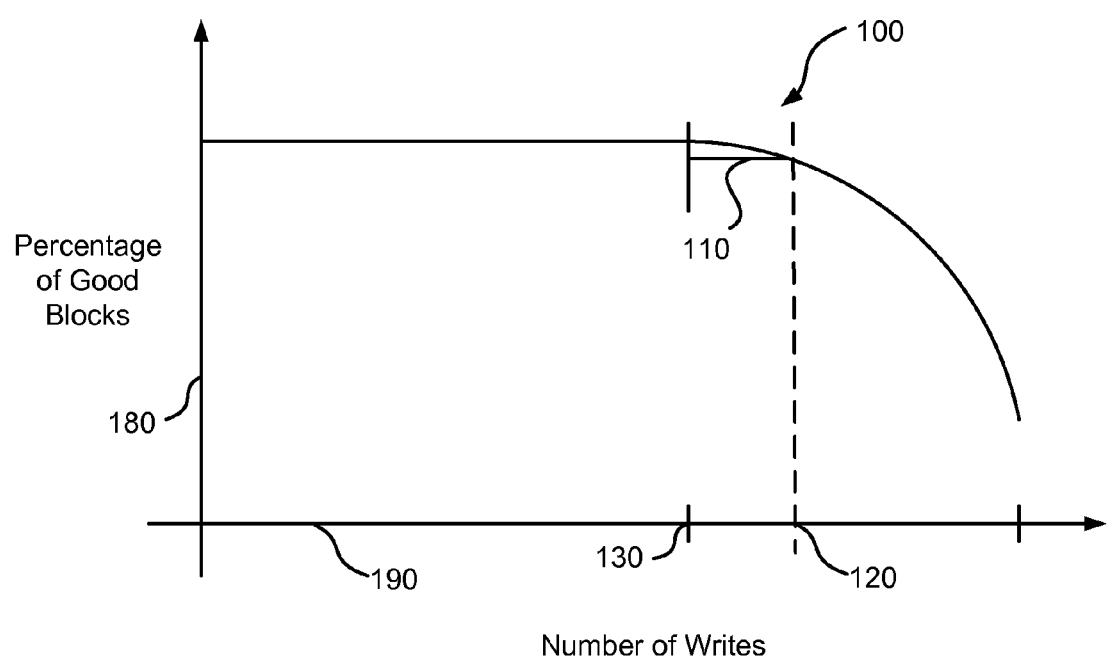
FIG. 1 graphically depicts the lifecycle of a prior art flash memory device by showing the relationship between a percentage of remaining good blocks in the flash memory device verses the number of writes to the flash memory device.

Turning to FIG. 1, a graph 100 depicts the lifecycle of a prior art flash memory device by showing the relationship between a percentage of remaining good blocks 180 in the flash memory device verses the number of writes 190 to the flash memory device. As shown, the percentage of remaining good blocks remains relatively constant until the number of writes reaches a value 130. At this point, the percentage of good blocks begins to decrease in proportion to the number of writes. By replacing exhausted blocks with backup blocks, the lifecycle of the flash memory device is extended by a number of writes indicated as element 110. Where the number of writes equals a value 120, the backup blocks have been used, and the flash memory device becomes unreliable. Element 110 corresponds to the number of writes between value 120 and value 130.

Various embodiments of the present invention utilize an error correction encoding circuit as a front end to a flash memory device to further extend the usable lifecycle of a flash memory device. In some embodiments of the present invention, the error correction encoding circuit is operable to encode write data using Reed Solomon encoding, and to decode read data using Reed Solomon decoding.

Figure 2:
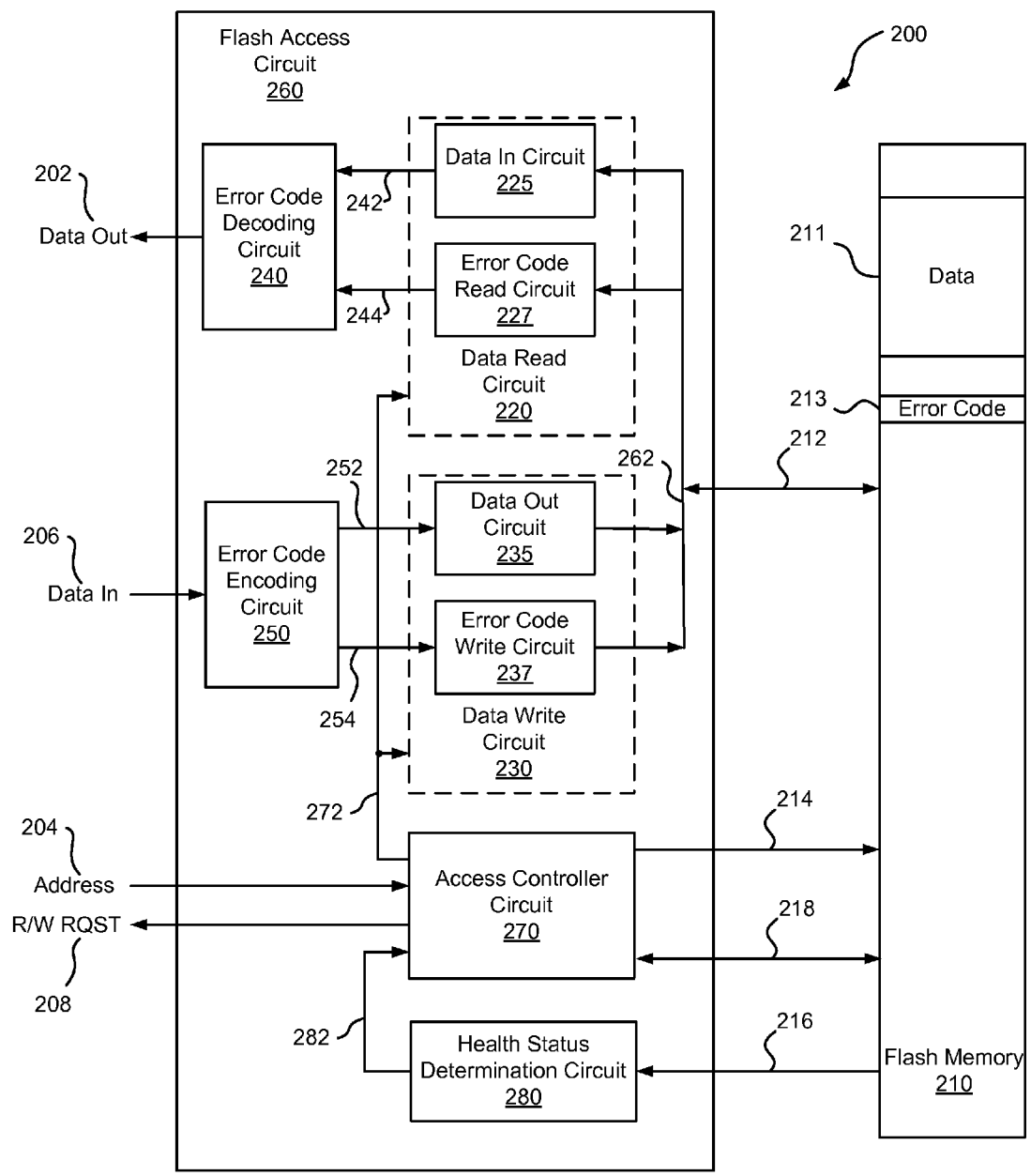
FIG. 2 shows an error correction enhanced flash memory system in accordance with one or more embodiments of the present invention.

Turning to FIG. 2, an error correction enhanced flash memory system 200 is shown in accordance with one or more embodiments of the present invention. As shown, error correction enhanced flash memory system 200 includes a standard flash memory device 210 that is capable of storing data that is provided to it via a flash access circuit 260. Of note, flash access circuit 260 may be implemented on a separate semiconductor package from flash memory device 210 allowing for a system level solution utilizing standard flash memory devices. Alternatively, flash access circuit 260 may be implemented on the same package as flash memory device 210. Also, it should be noted that while flash memory device 210 is depicted as a single flash memory device, in various embodiments of the present invention, flash access circuit 260 may be designed to support several flash memory devices arranged in a bank. Based upon the disclosure provided herein, one of ordinary skill in the art will recognize a variety of configurations that may be supported in accordance with different embodiments of the present invention.

Flash access circuit 260 is disposed between a host (not shown) and flash memory device 210. The host may be, but is not limited to, a microprocessor or interface device that is responsible for accessing data from a memory system. Based on the disclosure provided herein, one of ordinary skill in the art will recognize a variety of hosts that may be used in relation to embodiments of the present invention. Flash access circuit 260 receives a read/write request signal 208 and an address 204 from a host. Read/write request signal 208 is asserted high when a read from flash memory 210 at a location corresponding to address 204 is requested. When the requested read data is available from flash memory device 210, it is provided via a data out interface 202. Alternatively, read/write request signal 208 is asserted low when a write to flash memory 210 at a location corresponding to address 204 is requested. The data written to flash memory device 210 is received via a data in interface 206.

Flash access circuit 260 includes an error code decoding circuit 240, an error code encoding circuit 250, a data read circuit 220, a data write circuit 230, an access controller circuit 270, and a health status determination circuit 280.

Health status determination circuit 280 receives a status indicator 216 from flash memory device 210, and uses status indicator 216 to determine a percentage of usable blocks that remain in flash memory device 210. As the blocks of flash memory device 210 deteriorate over its lifetime, status indicator 216 will indicate this reduction as flash memory device 210 is used. Health status determination circuit 280 provides a percentage available output 282 to access controller circuit 270.

Error code encoding circuit 250 receives a data input via data in interface 206, and performs an encoding to generate an error code corresponding to the received data input. The generated error code is written by error code encoding circuit 250 to an error code write circuit 237 via an interface 254. The received data is written by error code encoding circuit 250 to a data out circuit 235 via an interface 252.

In one particular embodiment of the present invention, the error code is a multi-bit parity check sum as are known in the art. In such an embodiment, error code encoding circuit 250 implements a parity check algorithm. Such parity check sums may be designed to be less than five percent of the data to which it corresponds. In other embodiments of the present invention, the error code is a Reed Solomon error code as are known in the art. Use of a Reed Solomon error code may be desirable where clustered errors that are not easily detectable and/or correctable using other error correction encoding such as, for example, BCH error coding. In such embodiments, error code encoding circuit 250 implements a Reed Solomon encoder. Such Reed Solomon error codes may be designed to be less than five percent of the data to which it corresponds.

Data out circuit 235 is operable to write the data received via data in interface 206 to flash memory device 210 via data buses 262, 212. Access to the data buses 262, 212 is granted by access controller circuit 270 as more fully described below. Error code write circuit 237 writes the generated error code to flash memory device 210 under the direction of access controller circuit as more fully described below. It should be noted that in some cases the write of the generated error code is conditional and does not always occur. Also of note, the address in flash memory device 210 to which data out circuit 235 writes the data is different from the address to which error code write circuit 237 writes the generated error code. In various cases, the address space for the data and the error code are not contiguous. In other cases, the address spaces are contiguous.

Data read circuit 220 receives read data from flash memory device 210 via data buses 262, 212. Read data and corresponding error code availability on data buses 262, 212 is indicated to read data circuit 220 by access controller circuit 270 as more dully described below. Data in circuit 225 receives the read data from data bus 262 and provides the received data to error code decoding circuit 240 via an interface 242. Error code read circuit 227 retrieves any available error code from data bus 262 and provides the error code to error code decoding circuit 240 via an interface 244. Where no error code is available, error code read circuit 227 indicates such to error code decoding circuit 240 via interface 244.

Error code decoding circuit 240 performs an error correction on the data received from data in circuit 225 using error code received from error code circuit 227. Where, for example, the error code is a parity checksum value generated by error code encoding circuit 250, error code decoding circuit uses the checksum to correct any errors in the data received form data in circuit 225. As another example, where the error code is a Reed Solomon error code, error code decoding circuit 240 performs Reed Solomon decoding on the data received from data in circuit 225 to correct any errors.

Ultimately, the error corrected data is provided to the host via data out interface 202. Where no error code is available in relation to the data received via data in circuit 225, error code decoding circuit 240 provides the received data to the host via data out interface 202 without performing any decoding.

Access controller circuit 270 controls the operation of flash access circuit 260. In particular, access controller 270 modifies address 204 to yield a corresponding address 214 that is provided to flash memory device 210. Any address transformation circuit known in the art may be used to perform the address transformation appropriate for the particular system in which flash access circuit 260 is implemented and for the particular characteristics of flash memory device 210. In addition, access controller circuit provides interface control signals 218 to flash memory device 210. The combination of address 214 and interface control signals 218 provide access to flash memory device 210. Based on the disclosure provided herein, one of ordinary skill in the art will recognize various interfaces that may be supported by different flash memory devices. The combination of address 214 and interface control signals 218 may be tailored to match such interfaces depending upon the needs of a particular design.

In addition, access controller circuit 270 controls access to an internal data bus 262 that is connected to flash memory device 210 via a data bus 212. In particular, access controller circuit 270 provides a set of control signals 272 to both data read circuit 220 and data write circuit 230. Control signals 272 indicate when read data is available on data bus 262 to data read circuit 220, and data in circuit 225 accesses the information based on control signals 272. Control signals 272 also indicate to data read circuit 220 whether error code associated with the previously read data is available, and if available, when the error code is available on data bus 262. When available, error code read circuit 227 accesses the information based on control signals 272. Control signals 272 also indicate when data bus 262 is available to accept write data. When available, data out circuit 235 provides write data to data bus 262 that is written to flash memory device 210 in accordance with the combination of address 214 and interface control signals 218. The data is ultimately written to a selected region of flash memory device 210 (e.g., the region identified as data 211). Similarly, when appropriate (e.g., health status determination circuit 280 indicates that the percentage of good blocks is below a defined threshold), error code write circuit 237 provides the error code generated by error code encoding circuit 250 to data bus 262 that is written to flash memory device 210 in accordance with the combination of address 214 and interface control signals 218. The error code is ultimately written to a selected region of flash memory device 210 (e.g., the region identified as error code 213). Access controller circuit 270 maintains a table indicating which blocks in flash memory device have corresponding error code, and which do not. Thus, during a read of flash memory device 210, access controller circuit 270 is able to indicate to data read circuit 220 via control signals 272 whether error code will be available or not.

In a write operation, the host provides a write location via address 204 and an indication that a write is desired by appropriately asserting read/write request signal 208. In addition, the host provides a block of data to be written to flash memory device 210 via data in interface 206. Error code encoding circuit 250 performs the implemented error code algorithm to generate an error code. The error code is provided to error code write circuit 237 via interface 254, and the originally received data block is provided to data out circuit 235 via interface 252.

In addition, access controller circuit 270 translates address 204 into the appropriate block address using processes known in the art, and provides the block address as address 214 along with a write indicator via interface control signals 218. Access controller circuit 270 grants access to data bus 262 via control signals 272 causing data out circuit 235 to provide the originally received data block to data bus 262. Concurrently, access controller circuit 270 asserts the combination of address 214 and interface control signals 218 to cause the data on data bus 212 to be written to flash memory device 210 (e.g., data 211).

In addition, access controller circuit 270 determines whether the percentage of remaining good blocks in flash memory device 210 is below a defined threshold. This may be done by querying percentage available output 282 from health status determination circuit 280. Where the percentage of remaining good blocks in flash memory device 210 is above the threshold level, no error code is written to flash memory device 210, and access control circuit 270 indicates this in its internal table. Alternatively, where the percentage of remaining good blocks in flash memory device 210 is below the threshold level, access controller circuit grants access to data bus 262 by asserting control signals 272 to data write circuit 230. This causes error code write circuit 237 to provide the generated error code to data bus 262. Concurrently, access controller circuit 270 asserts the combination of address 214 and interface control signals 218 to cause the data on data bus 212 to be written to flash memory device 210 (e.g., error code 213). In addition, access control circuit 270 indicates the availability of error code in relation to the recently written data in its internal table.

In a read operation, the host provides a read location via address 204 and an indication that a read is desired by appropriately asserting read/write request signal 208. Access controller circuit 270 translates address 204 into the appropriate block address using processes known in the art, and provides the block address as address 214 along with a read indicator via interface control signals 218. When the requested read data is available on data buses 262, 212, access controller circuit 270 indicates the availability to data read circuit 220 causing data in circuit 225 to access the information from data bus 262.

In addition, access controller circuit 270 queries its internal table to determine whether error code is available for the block that is to be read. Where no error code is available, such is indicated to data read circuit 220 via control signals 272 causing error code read circuit 227 to indicate the unavailability of error code to error code decoding circuit 240. In this situation, error code decoding circuit 240 pulls data from data in circuit 225 and provides it unmodified to the host via data out interface 202. Alternatively, where error code is available, such is indicated to data read circuit 220 via control signals 272 causing error code read circuit 227 to access the error code from data bus 262 and to provide the error code to error code decoding circuit 240. In this situation, error code decoding circuit 240 pulls data from data in circuit 225 and performs the implemented error code decoding algorithm to correct any errors in the data received from data in circuit 225. The error corrected data from data in circuit 225 is then provided to the host via data out interface 202.

A summary of operation of flash access circuit 260 where Reed Solomon error correction encoding/decoding is used is provided in the following pseudocode:

```
If (Write AND percentage of good blocks greater than or equal to a
defined level)
{
    write the data received via data in interface 204 to flash memory
        device 210;
    update internal table indicating no error code associated with the
        block
}
Else If (Write AND percentage of good blocks less than the defined level)
{
    perform Reed Solomon encoding on data received via data in
        interface 204;
    write the data received via data in interface 204 to flash memory
        device 210;
    write error code generated by Reed Solomon encoding to flash
        memory device.
}
Else If (read AND no error code associated with the requested block)
{
    read the data from flash memory device 210 and provide the read
        data to the requesting host
}
Else If (read AND no error code associated with the requested block)
{
    read the data from flash memory device 210;
    perform Reed Solomon decoding to correct any errors in the read
        data;
    provide the corrected read data to the requesting host
}
```

Figure 3:
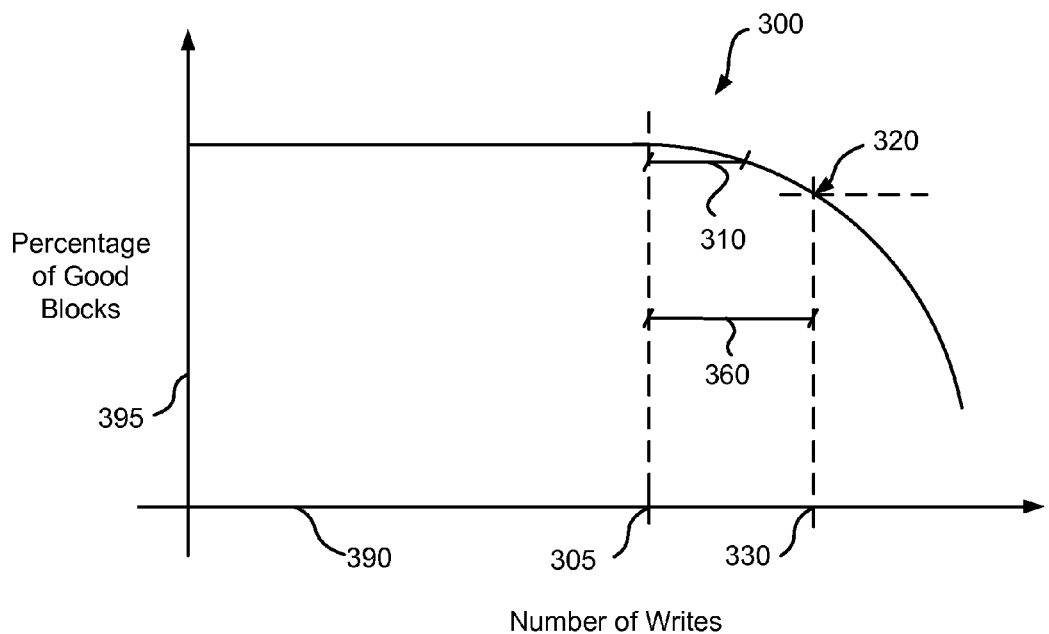
FIG. 3 graphically depicts the lifecycle of a flash memory device or system where the flash memory is augmented by a form of error correction encoding in accordance with some embodiments of the present invention.

Turning to FIG. 3, a graph 300 depicts the extended lifecycle of a flash memory device utilizing an error encoder/decoder circuit on the front end in accordance with one or more embodiments of the present invention. In particular, graph 300 depicts the relationship between a percentage of remaining good blocks 395 in the flash memory device verses the number of writes 390 to the flash memory device. As shown, the percentage of remaining good blocks remains relatively constant until the number of writes reaches a value 305. At this point, the percentage of good blocks begins to decrease in proportion to the number of writes. By standard replacement of exhausted blocks with backup blocks, the lifecycle of the flash memory device is extended by a number of writes indicated as a period 310.

Sometime before the number of backup blocks are fully used (i.e., at a threshold percentage of remaining good blocks), error code is stored in the flash memory device in relation to data written to the flash memory device. These added error codes allow for error correction of data retrieved from the flash memory device. Such error correction allows for data reliability for an extended period (i.e., period 360 less period 310), and for data reliability where the percentage of remaining good blocks falls to a level 320.

Figure 4:
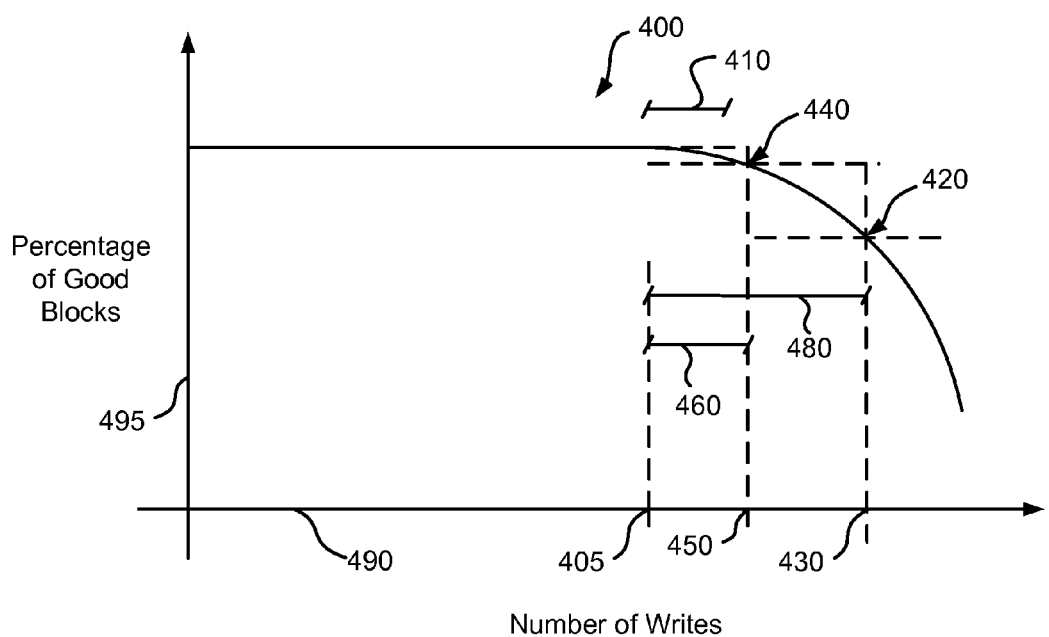
FIG. 4 graphically depicts the lifecycle of a flash memory device or system where the flash memory is augmented by two forms of error correction encoding in accordance with various embodiments of the present invention.

Turning to FIG. 4, a graph 400 depicts the extended lifecycle of a flash memory device utilizing two forms of error correction encoding in accordance with various embodiments of the present invention. In this case, a flash access circuit on the front end of a flash memory device may implement Reed Solomon error correction encoding/decoding, and the flash memory device itself may implement an internal BCH error correction encoding/decoding as is known in the art. Based on the disclosure provided herein, one of ordinary skill in the art will recognize other combinations of error correction encoding/decoding that may be used in relation to different embodiments of the present invention. In particular, graph 400 depicts the relationship between a percentage of remaining good blocks 495 in the flash memory device verses the number of writes 490 to the flash memory device. As shown, the percentage of remaining good blocks remains relatively constant until the number of writes reaches a value 405. At this point, the percentage of good blocks begins to decrease in proportion to the number of writes. By standard replacement of exhausted blocks with backup blocks, the lifecycle of the flash memory device is extended by a number of writes indicated as a period 410. The internal error correction encoding/decoding by the flash memory device allows an extension of lifecycle until a percentage of remaining good blocks falls to a value 440 (corresponding to a number 450 of writes to the flash memory device).

Sometime before the number of backup blocks are fully used and the ability of the error correction encoding/decoding internal to the flash memory device is exhausted (i.e., at a defined threshold percentage of remaining good blocks), error code is stored in the flash memory device in relation to data written to the flash memory device. These added error codes allow for error correction of data retrieved from the flash memory device. Such error correction allows for data reliability for an extended period (i.e., period 480 less period 460), and for data reliability where the percentage of remaining good blocks falls to a level 420.

Figure 5:
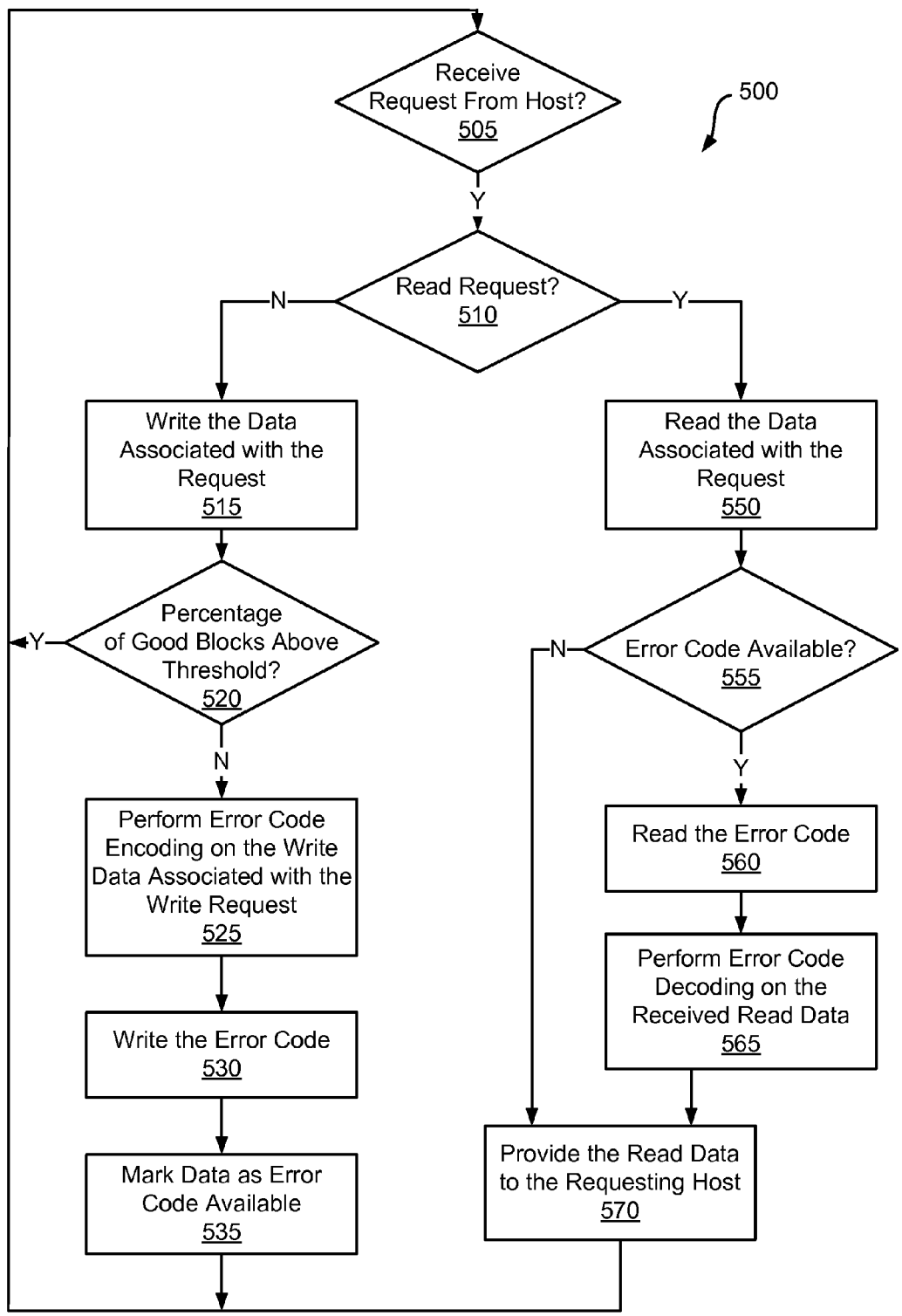
FIG. 5 is a flow diagram showing a method in accordance with various embodiments of the present invention for implementing error correction processing in relation to a flash memory device in accordance with various embodiments of the present invention.

Turning to FIG. 5, a flow diagram 500 shows a method in accordance with various embodiments of the present invention for implementing error correction processing in relation to a flash memory device in accordance with various embodiments of the present invention. Following flow diagram 500, it is determined whether a request has been received from a host (block 505). Such a request may be indicated, for example, by assertion of one or more interface signals provided by the host to a flash access circuit. In turn, it is determined whether the request is a request to read or a request to write a flash memory device associated with the flash access circuit (block 510). This determination may be made based on, for example, the assertion level of a read/write request interface signal from the host to the flash access circuit.

Where a write request is received (block 510), the data received from the host is written to the appropriate block in the flash memory device (block 515). It is determined whether the number of remaining good blocks in the flash memory device is above a threshold level (block 520). Where the number of remaining good blocks in the flash memory device exceeds the threshold level (block 520), the process of writing is complete.

Alternatively, where the number of remaining good blocks in the flash memory device is less than or equal to the threshold level (block 520), error code encoding is performed on the data associated with the write request (i.e., the data written in block 515) (block 525). Such error code encoding may be any encoding known in the art where an error correction code is generated for a corresponding data set. As one example, the error code encoding may be a relatively simple parity checksum generation, or a more complex Reed Solomon error correction encoding. Based upon the disclosure provided herein, one of ordinary skill in the art will recognize a variety of error code encodings that may be performed in relation to different embodiments of the present invention. The error code generated in block 525 is written to the flash memory device (block 530), and an internal table is updated to indicate that error code data is available (block 535).

Where a read request is received (block 510), data from the location identified in the read request is accessed from the flash memory device (block 550). It is then determined if an error code is available for the read data (block 555). This determination may be made by reading the internal table updated in block 535. Where an error code is not available (block 555), the received read data is forwarded to the requesting host (block 570), and the read process ends.

Alternatively, where an error code is available (block 555), the error code is read from the flash memory device (block 560). This error code is then used to perform error code decoding on the received read data (block 565). Such error code decoding is operable to correct one or more bit errors in the data retrieved from the flash memory device. As one example, the error code decoding may utilize a set of parity check equations to identify and/or correct one or more bits in the received data. As another example, the error code decoding may be a Reed Solomon decoding that is operative to identify and/or correct one or more bits in the received data. Based upon the disclosure provided herein, one of ordinary skill in the art will recognize a variety of error code encodings that may be performed in relation to different embodiments of the present invention. The corrected data set is then provided to the requesting host (block 570), and the read process completes.

In conclusion, the invention provides novel systems, devices, methods and arrangements for flash memory usage. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A memory system, the memory system comprising:
   a flash memory device; and
   a flash access circuit operable to:
   determine a health status of the flash memory device;
   perform an error code encoding algorithm on a data set to yield an error code, to write the data set to the flash memory device at a first location; and
   selectively write to the flash memory based at least in part on the health status one of: the data set alone, and a combination of the data set and the error code.

2. The memory system of claim 1, wherein upon selection of the combination of the data set and the error code results in writing the data set to a first location and the error code to a second location that is not contiguous with the first location.

3. The memory system of claim 2, wherein the error code is a first error code, wherein the data set is a first data set, and wherein the flash access circuit is further operable to:
   read a second data set from a third location in the flash memory device;
   read a second error code from a fourth location in the flash memory device; and
   perform an error code decoding algorithm on the second data set, wherein at least one bit of the second data set is modified to yield a modified data set.

4. The memory system of claim 3, wherein the third location is contiguous with the fourth location.

5. The memory system of claim 3, wherein the error code decoding algorithm is a Reed Solomon error correction decoding algorithm.

6. The memory system of claim 1, wherein the health status is selected from a group consisting of: a number of remaining good blocks in the flash memory device, and a percentage of remaining good blocks in the flash memory device.

7. The memory system of claim 1, wherein the flash access circuit is operable to write the data set alone to the flash memory device when the health status is above a defined level, and wherein the flash access circuit is operable to write the combination of the data set and the error code to the flash memory device when the health status is below the defined level.

8. The memory system of claim 1, wherein the flash access circuit is operable to omit performing the error code encoding algorithm on the data set to yield the error code and to write the data set alone to the flash memory device when the health status is above a defined level.

9. The memory system of claim 1, wherein the error code encoding algorithm is a Reed Solomon error correction encoding algorithm.

10. A memory access circuit, the circuit comprising:
   an error code encoding circuit operable to receive a data set and to perform an error code encoding algorithm on the data set to yield an error code; and
   a data write circuit operable to selectively write one of the data set alone, and a combination of the data set and the error code to a memory device based upon a health status of the memory device.

11. The memory access circuit of claim 10, wherein the circuit further comprises:
   a health status determination circuit, wherein the health status determination circuit is operable to determine the health status of the memory device, and wherein the health status is selected from a group consisting of: a number of remaining good blocks in the memory device, and a percentage of remaining good blocks in the flash memory device.

12. The memory access circuit of claim 10, wherein the combination of the data set and the error code are written to the memory device when the health status is below a defined threshold.

13. The memory access circuit of claim 10, wherein the data set alone is written to the memory device when the health status is above a defined threshold.

14. The memory access circuit of claim 10, wherein the circuit further comprises:
   an access controller circuit operable to update a table indicating whether an error code is available in relation to a block of memory in the memory device.

15. The memory access circuit of claim 14, wherein the data set is a first data set, wherein the error code is a first error code, and wherein the circuit further comprises:
   a data read circuit operable to read a second data set and a second error code corresponding to the second data set from the memory device; and
   an error code decoding circuit operable to receive the second data set and the second error code, and to perform an error code decoding algorithm on the second data set, wherein the error code decoding algorithm modifies at least one bit of the second data set to yield a modified data set.

16. The memory access circuit of claim 14, wherein the data set is a first data set, and wherein the circuit further comprises:
   a data read circuit operable to read a second data set from the memory device;
   wherein the access controller circuit operable to provide an indication that an error code is not available in relation to the second data set; and
   an error code decoding circuit operable to receive the second data set and the indication that an error code is not available in relation to the second data set, and based thereon to omit performing an error code decoding algorithm on the second data set.

17. A method for implementing error correction processing in relation to a flash memory device, the method comprising:
   receiving a write request and a data set;
   determining a health status of a flash memory device;
   based at least in part on the health status of the flash memory device being below a defined level:
      performing an error code encoding algorithm on the data set to yield an error code;
      writing both the data set to the flash memory device and the error code to the flash memory device; and
   based at least in part on the health status of the flash memory device being above a defined level:
      writing the data set alone to the flash memory device.

18. The method of claim 17, wherein the method further comprises:
   accessing the data set from the flash memory device;
   accessing the error code from the flash memory device; and
   performing an error code decoding using the data set and the error code, wherein at least one bit of the data set is corrected.

19. The method of claim 18, wherein:
   the error code encoding algorithm is a Reed Solomon error correction encoding algorithm;
   the error code decoding algorithm is a Reed Solomon error correction decoding algorithm; and
   the health status of the flash memory device is selected from a group consisting of: a number of remaining good blocks in the flash memory device, and a percentage of remaining good blocks in the flash memory device.

20. A memory system, the memory system comprising:
   a flash memory device; and
   a flash access circuit operable to:
      determine a health status of the flash memory device;
      selectively perform an error code encoding algorithm on a data set to yield an error code based upon the health status;
      write the data set alone to the flash memory when the error code is not available; and
      write a combination of the data set and the error code to the flash memory when the error code is available.

21. The memory system of claim 20, wherein the error code encoding is performed when the health status is below a defined threshold.

22. The memory system of claim 20, wherein performance of the error code encoding is omitted when the health status is above a defined threshold.

* * * * *